(12) United States Patent
Wang et al.

(10) Patent No.: US 9,768,382 B2
(45) Date of Patent: Sep. 19, 2017

(54) DISPLAY SUBSTRATE, ITS MANUFACTURING METHOD AND DISPLAY DEVICE

(71) Applicant: BOE TECHNOLOGY GROUP CO., LTD., Beijing (CN)

(72) Inventors: Huifeng Wang, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/894,003

(22) PCT Filed: Apr. 21, 2015

(86) PCT No.: PCT/CN2015/077060
§ 371 (c)(1),
(2) Date: Nov. 25, 2015

(87) PCT Pub. No.: WO2016/101452
PCT Pub. Date: Jun. 30, 2016

(65) Prior Publication Data
US 2016/0359112 A1    Dec. 8, 2016

(30) Foreign Application Priority Data

Dec. 26, 2014    (CN) .......................... 2014 1 0831907

(51) Int. Cl.
*H01L 29/08*    (2006.01)
*H01L 51/00*    (2006.01)
*H01L 21/77*    (2017.01)
*H01L 27/12*    (2006.01)
*H01L 27/32*    (2006.01)
*H01L 51/50*    (2006.01)

(52) U.S. Cl.
CPC .......... *H01L 51/0005* (2013.01); *H01L 21/77* (2013.01); *H01L 27/12* (2013.01); *H01L 27/3246* (2013.01); *H01L 51/5012* (2013.01); *H01L 2227/323* (2013.01)

(58) Field of Classification Search
CPC ............. H01L 51/0005; H01L 27/3246; H01L 51/5012; H01L 2227/323
USPC ......................................................... 257/40
See application file for complete search history.

(56) References Cited

U.S. PATENT DOCUMENTS 7,098,590 B2 *  8/2006  Lim ..................... H01L 51/5265
                                                    313/504
7,365,367 B2 *  4/2008  Han ..................... H01L 27/3246
                                                    257/40
8,692,454 B2 *  4/2014  Sakata .................. B82Y 20/00
                                                    313/504

(Continued)

*Primary Examiner* — Xinning Niu
*Assistant Examiner* — Vu A Vu
(74) *Attorney, Agent, or Firm* — Harness, Dickey & Pierce, P.L.C.

(57) ABSTRACT

The present disclosure relates to the field of display technology, and provides a display substrate, its manufacturing method, and a display device. Pixel partition walls of the display substrate include first pixel partition walls for defining first pixel regions and second pixel partition walls for defining second pixel regions. Each first pixel partition wall is of a height greater than each second pixel partition wall, and a plurality of adjacent second pixel regions is located at an identical first pixel region.

20 Claims, 3 Drawing Sheets

(56) References Cited

U.S. PATENT DOCUMENTS

2010/0141875 A1* 6/2010 Shim ................ G02F 1/133516
349/106

* cited by examiner

DISPLAY SUBSTRATE, ITS MANUFACTURING METHOD AND DISPLAY DEVICE

CROSS-REFERENCE TO RELATED APPLICATION

This application is the U.S. national phase of PCT Application No. PCT/CN2015/077060 filed on Apr. 21, 2015, which claims a priority of the Chinese Patent Application No. 201410831907.2 filed on Dec. 26, 2014, the disclosures of which are incorporated in their entirety by reference herein.

TECHNICAL FIELD

The present disclosure relates to the field of display technology, in particular to a display substrate, its manufacturing method and a display device.

BACKGROUND

Organic light-emitting diode (OLED) display device has been considered as a next-generation display technology due to its advantages over a liquid crystal display, such as self-luminescence, rapid response, wide viewing angle, high brightness, vivid colors, light weight and thinness.

As a main structure of the OLED display device, an OLED display substrate includes a plurality of pixel regions defined by a pixel definition layer, and each pixel region includes an OLED that emits a ray in a specific color, respectively. During the manufacture of the OLED display substrate, films of the OLED are mainly formed by an evaporation or solution process. The evaporation process has been widely used for the manufacture of a small-size display device. The solution process mainly includes inkjet printing, spaying, spinning, and screen printing. Due to a high material utilization rate and being applicable to a large-size product, the inkjet printing technique has been considered as an important way for the mass production of the large-size OLED display device.

In order to improve the production efficiency, a sprayer of an inkjet printing device includes a plurality of nozzles, so as to form a plurality of display layers (e.g., an organic light-emitting layer) at pixel regions in an identical color. However, during the actual manufacture, it is impossible to fully ensure an even ink amount from the respective nozzles. Prior to the inkjet printing, it is required to precisely adjust the ink amount for each nozzle, so that an error among ink volumes from the nozzles in unit time is less than ±0.3%. When a larger error occurs, it is able for human's eyes to distinguish between pixels due to brightness differences caused by this error after the display device is lightened up. Hence, one of the core techniques for inkjet printing lies in how to provide an even inkjet amount for the pixels.

Figure 1:
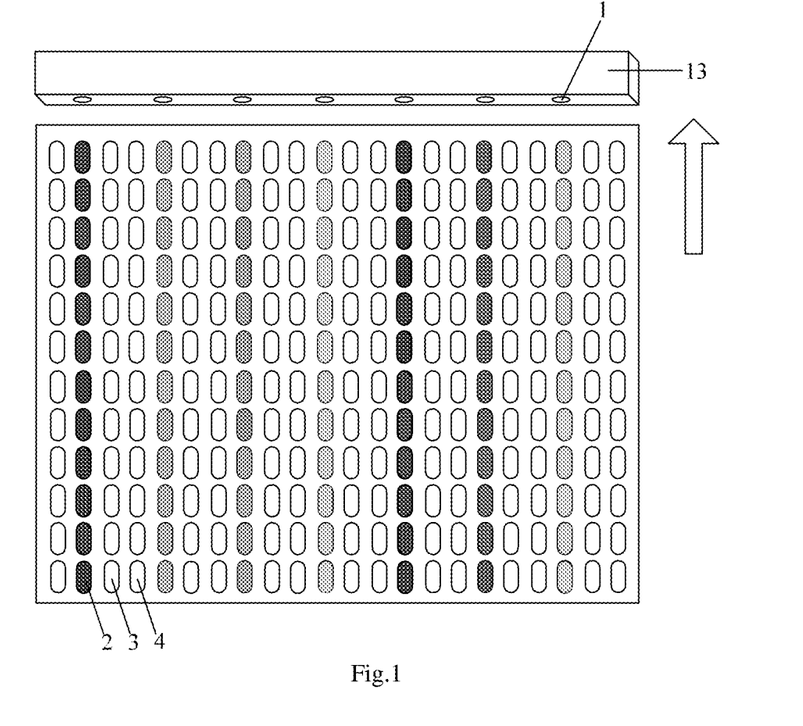
FIG. 1 is a schematic view showing existing display layers at pixel regions in an identical color by inkjet printing.

As shown in FIG. 1, pixel regions are arranged in a matrix form in the related art, and each pixel region is usually of a strip-like shape (e.g., a red pixel region 2, a red pixel region 3 and a blue pixel region 4). Currently, each sprayer 13 from a manufacturer is usually provided with 256 or 512 nozzles 1. Hence, for the mass production of a TV with a resolution of 3840*2160, when the sprayer 13 with 256 nozzles 1 is adopted, 5 sprayers 13 are required so as to print the 3840 display layers in an identical row and at pixel regions in an identical color, and then the 5 sprayers 13 are required to be moved simultaneously in a direction as shown by an arrow in FIG. 1 so as to print the OLEDs in an identical color in all of the rows. Usually, it takes 3 to 5 hours to control a volume error for 256 nozzles 1 to be less than 0.3%, so it will take a very long time period to control the volume error for 1280 nozzles 1 to be less than 0.3%. In addition, after a certain period of time, it is required to re-adjust the ink volumes from the 1280 nozzles 1 at the expense of a lot of time and ink. In FIG. 1, different grayscales represent different thicknesses of the display layers in the red pixel units 2.

SUMMARY

An object of the present disclosure is to provide a display substrate and its manufacturing method, so as to prevent the occurrence of uneven brightness due to different thicknesses of pixel layers for pixel units formed by inkjet printing.

Another object of the present disclosure is to provide a display device, so as to prevent the display quality thereof from being seriously affected due to the uneven thicknesses of display layers.

In one aspect, the present disclosure provides in one embodiment a method for manufacturing a display substrate, including steps of: forming pixel partition walls for defining pixel regions of the display substrate; and forming display layers at the pixel regions by inkjet printing. The step of forming the pixel partition walls includes: forming first pixel partition walls for defining first pixel regions and second pixel partition walls for defining second pixel regions, each first pixel partition wall being of a height greater than each second pixel partition wall, and a plurality of adjacent second pixel regions being located within an identical first pixel region. The step of forming the display layers at the pixel regions by inkjet printing includes: inkjet printing an identical material at each first pixel region by at least one nozzle, so as to form the identical display layer at the plurality of second pixel regions within the first pixel region, the display layer being of a thickness greater than the height of each second pixel partition wall.

Alternatively, the first pixel regions are each of a strip-like shape and arranged in a matrix form.

Alternatively, a short side of each first pixel region extends in a row direction, the identical material is inkjet-printed at all the first pixel regions in an identical column simultaneously by a sprayer including a plurality of nozzles, and the sprayer is moved so as to inkjet print the corresponding material at the first pixel regions in all the columns.

Alternatively, the identical material is inkjet-printed at each first pixel region by at least two nozzles.

Alternatively, the step of forming the first pixel partition walls and the second pixel partition walls includes: forming patterns of first layers, the first layers being located at regions where the first pixel partition walls and the second pixel partition walls are located; and forming patterns of second layers on the first layers, the second layers being located at regions where the first pixel partition walls are located.

Alternatively, the display substrate is an OLED display substrate or a color filter substrate of a liquid crystal panel.

Alternatively, when the display substrate is an OLED display substrate, an OLED for emitting a ray in a specific color is formed at each second pixel region. The method further includes: forming a bottom electrode of the OLED on a base substrate; forming the second pixel partition walls on the base substrate with the bottom electrode, the second pixel partition walls defining the second pixel regions; forming the first pixel partition walls on the base substrate with the second pixel walls, the first pixel partition walls defining the first pixel regions, and the plurality of adjacent second pixel regions being located at an identical first pixel region; and inkjet printing an identical material at the first pixel regions by at least one nozzle, so as to form the display layers for emitting rays in an identical color at the plurality of second pixel regions within each first pixel region, the display layers at the first pixel regions in adjacent columns emitting rays in different colors.

Alternatively, the display layer includes an organic light-emitting layer.

In another aspect, the present disclosure provides in one embodiment a display substrate, including: pixel partition walls for defining pixel regions of the display substrate, the pixel partition walls including first pixel partition walls for defining first pixel regions and second pixel partition walls for defining second pixel regions, each first pixel partition wall being of a height greater than each second pixel partition wall, a plurality of adjacent second pixel regions being located at an identical first pixel region; and an identical display layer formed at the plurality of second pixel regions within each first pixel region, the display layer being of a thickness greater than the height of each second pixel partition wall.

Alternatively, the first pixel regions are each of a strip-like shape and arranged in a matrix form.

Alternatively, a short side of each first pixel region extends in a row direction, and the display layers at the first pixel regions in an identical column are made of an identical material and formed by a single inkjet printing process.

Alternatively, each first pixel partition wall includes a first layer and a second layer on the first layer, and each second pixel partition wall includes the first layer.

Alternatively, the first layer is of a thickness of 10 nm to 100 μm.

Alternatively, the second layer is of a thickness of 100 nm to 100 μm.

Alternatively, the first layer and the second layer are each made of resin, organic silicon or silicon dioxide.

Alternatively, the display substrate is an OLED display substrate, or a color filter substrate of a liquid crystal panel.

Alternatively, when the display substrate is an OLED display substrate, an OLED for emitting a ray in a specific color is arranged at each second pixel region. The display substrate includes: a bottom electrode of the OLED; the second pixel partition walls for defining the second pixel regions; and the first pixel partition walls for defining the first pixel regions, the plurality of adjacent pixel regions being located at an identical first pixel region. The display layers for emitting rays in an identical color are arranged at the plurality of second pixel regions within each first pixel region, and the display layers at the adjacent first pixel regions in adjacent columns emit rays in different colors.

Alternatively, the display layer includes an organic light-emitting layer.

Alternatively, three adjacent second pixel regions are located at an identical first pixel region.

In yet another aspect, the present disclosure further provides in one embodiment a display device including the above-mentioned display substrate.

According to the embodiments of the present disclosure, the pixel partition walls of the display substrate include the first pixel partition walls for defining the first pixel regions and the second pixel partition walls for defining the second pixel regions, each first pixel partition wall is of a height greater than each second pixel partition wall, and a plurality of adjacent second pixel regions is located at an identical first pixel region. When an identical material is inkjet-printed at each first pixel region, an identical display layer may be formed at the plurality of second pixel regions within the first pixel region, and the display layer is of a thickness greater than the height of the second pixel partition wall. In other words, the display layers at each first pixel region are connected to each other, and a corresponding pixel layer is formed at the first pixel region by short-side printing. As a result, it is able to ensure an even thickness of the display layers at the second pixel regions, thereby to improve the quality of the display substrate as well as the display quality.

BRIEF DESCRIPTION OF THE DRAWINGS

In order to illustrate the technical solutions of the present disclosure or the related art in a clearer manner, the drawings desired for the present disclosure or the related art will be described briefly hereinafter. Obviously, the following drawings merely relate to some embodiments of the present disclosure, and based on these embodiments, a person skilled in the art may obtain the other drawings without any creative effort.

DETAILED DESCRIPTION

The present disclosure provides in one embodiment a method for manufacturing a display substrate, so as to prevent the occurrence of uneven brightness due to different thicknesses of display layers formed at pixel regions by inkjet printing.

The method includes forming first pixel partition walls for defining first pixel regions and forming second pixel partition walls for defining second pixel regions. Each first pixel partition wall is of a height greater than each second pixel partition wall, and a plurality of adjacent second pixel regions is located at an identical first pixel region. According to the method in the embodiment of the present disclosure, when an identical material is inkjet-printed at each first pixel region, an identical display layer may be formed at the plurality of second pixel regions within the first pixel region, and the display layer is of a thickness greater than the height of the second pixel partition wall. In other words, the display layers at each first pixel region are connected to each other, and a corresponding pixel layer is formed at the first pixel region by short-side printing. As a result, it is able to ensure an even thickness of the display layers at the second pixel regions, thereby to improve the quality of the display substrate as well as the display quality.

The present disclosure will be described hereinafter in conjunction with the drawings and embodiments. The following embodiments are for illustrative purposes only, but shall not be used to limit the scope of the present disclosure.

The present disclosure provides in one embodiment a method for manufacturing a display substrate, which includes steps of forming pixel partition walls for defining pixel regions of the display substrate, and forming display layers at the pixel regions by inkjet printing.

The step of forming the pixel partition walls includes forming first pixel partition walls for defining first pixel regions and second pixel partition walls for defining second pixel regions. Each first pixel partition wall is of a height greater than each second pixel partition wall, and a plurality of adjacent second pixel regions is located within an identical first pixel region.

The step of forming the display layers at the pixel regions by inkjet printing includes inkjet printing an identical material at each first pixel region by at least one nozzle, so as to form the identical display layer at the plurality of second pixel regions within the first pixel region, the display layer being of a thickness greater than the height of each second pixel partition wall.

Alternatively, the first pixel regions are each of a strip-like shape and arranged in a matrix form.

Alternatively, a short side of each first pixel region extends in a row direction, the identical material is inkjet-printed at all the first pixel regions in an identical column simultaneously by a sprayer including a plurality of nozzles, and the sprayer is moved so as to inkjet print the corresponding material at the first pixel regions in all the columns.

According to above-mentioned method, it is able to ensure an even thickness of the display layers at the pixel regions, thereby to improve the quality of the display substrate.

Figure 2:
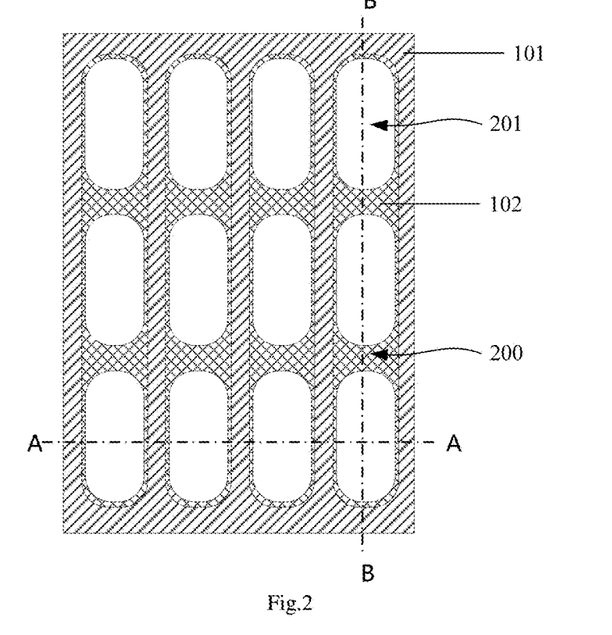
FIG. 2 is a schematic view showing a display substrate according to one embodiment of the present disclosure.
Figure 3:
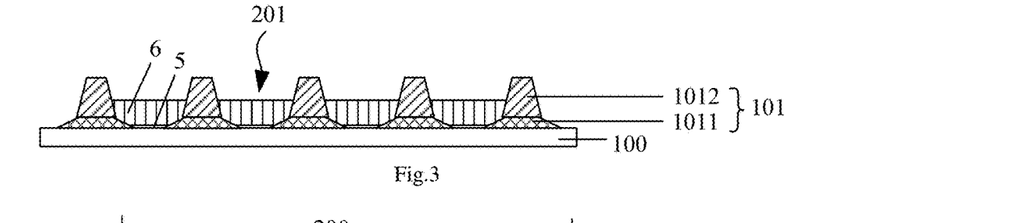
FIG. 3 is a sectional view along line A-A in FIG. 2.
Figure 4:
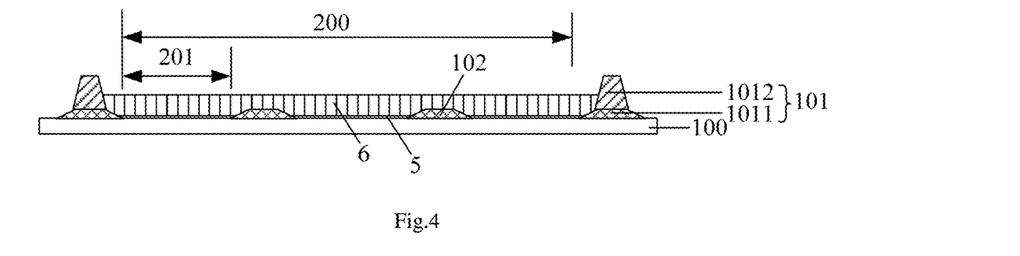
FIG. 4 is a sectional view along line B-B in FIG. 2.

Correspondingly, referring to FIGS. 2-4, the present disclosure further provides in one embodiment a display substrate which includes pixel partition walls for defining pixel regions of the display substrate and display layers located at the pixel regions. The pixel partition walls include first pixel partition walls 101 and second pixel partition walls 102, and each first pixel partition wall 101 is of a height greater than each second pixel partition wall 102, i.e., a top face of the first pixel partition wall 101 is located at a level higher than that of the second pixel partition wall 102. The first pixel partition walls 101 define first pixel regions 200, the second pixel partition walls 102 define second pixel regions 201, and a plurality of adjacent second pixel regions 201 is located at an identical first pixel region 200. The display layers at the plurality of second pixel regions 201 within an identical first pixel region 200 are made of an identical material, and the display layer is of a thickness greater than the height of the second pixel partition wall 102. The first pixel regions 200 are each of a strip-like shape, and arranged in a matrix form. A short side of the first pixel region 200 extends in a row direction, and the display layers at the first pixel regions in an identical column are made of an identical material and formed by a single inkjet printing process, as shown in FIG. 4.

Usually, three adjacent second pixel regions 201 may be located at an identical first pixel region 200.

In an alternative embodiment, the first pixel regions 200 in an identical column are in an identical color, i.e., the display layers at these first pixel regions are made of an identical material. The first pixel regions 200 in adjacent columns are in difference colors. To be specific, the first pixel regions 200 in adjacent rows may be R, G and B alternately. Each first pixel region 200 merely includes a column of second pixel regions 201, i.e., when a short side of the first pixel region 200 extends in a row direction, its long side extends in a column direction. R represents a red pixel region, G represents a green pixel region and B represents a blue pixel region.

It should be appreciated that, "the short side of the first pixel region 200 extending in the row direction" here does not mean that its short side is necessarily parallel to a row axis, and instead, the short side may also be a folded, curved or diagonal line, with an angle between an extension direction of a connection line connecting its start point and terminal point and the row direction being not a right angle. Identically, "the long side of the first pixel region 200 extending in the column direction" does not mean that its long side is necessarily parallel to a column axis.

Figure 5:
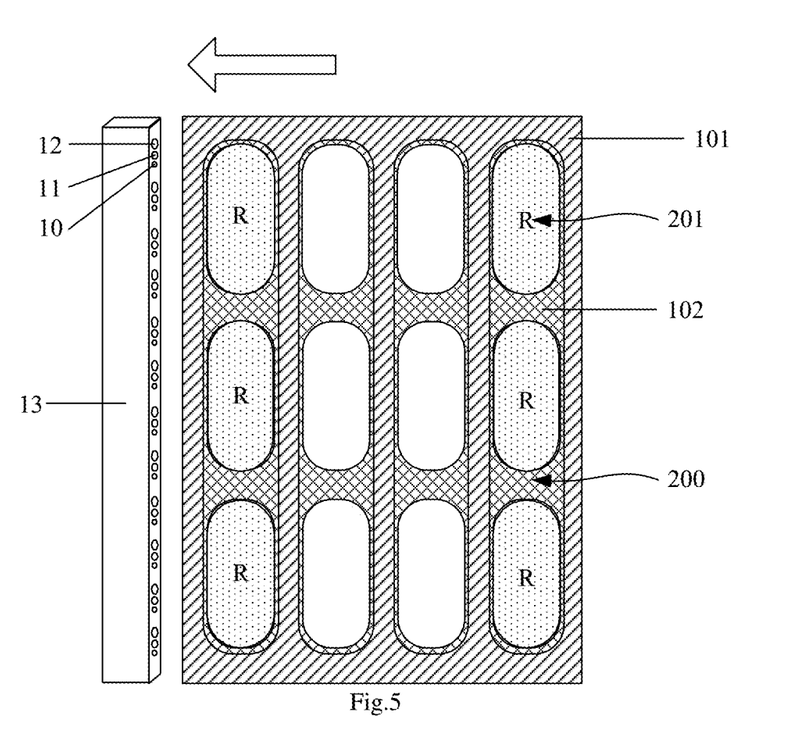
FIG. 5 is a schematic view showing a process of forming display layers at pixel regions in an identical color according to one embodiment of the present disclosure.

Further, an identical material is inkjet-printed at all the first pixel regions 200 in an identical column simultaneously by a sprayer 13 including a plurality of nozzles, and the sprayer is moved so as to inkjet print the corresponding material at the first pixel regions in all the columns, as shown in FIG. 5 (which merely shows the first pixel regions 200 in one row). Of course, the material may be inkjet-printed at all the first pixel regions 200 in any other ways. For example, the material may be inkjet-printed at all the first pixel regions 200 in an identical row simultaneously by the sprayer including a plurality of nozzles, and then the sprayer is moved so as to inkjet print the corresponding material at the first pixel regions in all the rows. For another example, the corresponding material may be inkjet-printed at all the first pixel regions 200 randomly.

Alternatively, at least two nozzles (e.g., nozzles 10, 11, 12 in FIG. 5) correspond to each first pixel region 200, i.e., the identical material is inkjet-printed at each first pixel region 200 by at least two nozzles. The material printed at each first pixel region 200 comes from different nozzles, so it is able to reduce a volume error for the ink from the nozzles, thereby to further reduce a thickness error between the first pixel regions 200, and improve the production efficiency. During the actual application, the nozzles 10, 11 and 12 may be of different types, so as to reduce the volume error in a better manner.

In order to form the first pixel regions and the second pixel regions, the step of forming the first pixel partition walls for defining the first pixel regions and forming the second pixel partition walls for defining the second pixel regions may include: forming patterns of first layers, the first layers being located at regions where the first pixel partition walls 101 and the second pixel partition walls 102 are located; and forming patterns of second layers on the first layers, the second layers being located at regions where the first pixel partition walls 101 are located.

The resultant first pixel partition wall 101 includes the first layer 1011 and the second layer 1012, the resultant second pixel partition wall 102 includes the first layer, and a height difference between the first pixel partition wall 101 and the second pixel partition wall 102 is just a thickness of the second layer.

The first layer and the second layer may be made of resin (e.g., polyimide), organic silicon or silicon dioxide.

To be specific, the first layer may be of a thickness of 10 nm to 100 µm, and alternatively 50 nm to 500 nm. The second layer may be of a thickness of 100 nm to 100 µm, and alternatively, 500 nm to 1500 nm. The second pixel partition wall 102 is of a height equal to the thickness of the first layer, e.g., 10 nm to 100 µm, and the first pixel partition wall 101 is of a height equal to a sum of the thicknesses of the first layer and the second layer, e.g., 110 nm to 200 µm.

In the embodiments of the present disclosure, the display substrate may be a color filter substrate of a liquid crystal panel, or an organic OLED display substrate.

When the display substrate is a color filter substrate of a liquid crystal panel, the pixel partition walls may be black matrices, and the display layer is a color filter layer through which a ray in a specific color is transmitted. At this time, the method further includes forming a planarization layer on the display layer.

For the liquid crystal panel with a longitudinal electric field, a common electrode is formed on the color filter substrate, and at this time, the method further includes forming the common electrode on the planarization layer, so as to form the longitudinal electric field with a pixel electrode on an array substrate, thereby to drive liquid crystal molecules to be deflected and display a specific color.

When the display substrate is an OLED display substrate, the pixel partition walls form a pixel definition layer, and an OLED for emitting a ray in a specific color is formed at each second pixel region. At this time, the method includes forming a bottom electrode of the OLED on a base substrate; forming the second pixel partition walls on the base substrate with the bottom electrode, the second pixel partition walls defining the second pixel regions; forming the first pixel partition walls on the base substrate with the second pixel walls, the first pixel partition walls defining the first pixel regions, and the plurality of adjacent second pixel regions being located at an identical first pixel region; and inkjet printing an identical material at the first pixel regions by at least one nozzle, so as to form the display layers for emitting rays in an identical color at the plurality of second pixel regions of each first pixel region, the display layers at the first pixel regions in adjacent columns emitting rays in different colors.

The display layer may be an organic light-emitting layer. Of course, it may also include any other layers such as an electron transport layer and a hole transport layer.

In addition, according to the practical need, the bottom electrode may be an anode or cathode of the OLED, which is not particularly defined herein.

In an alternative embodiment, an identical material is inkjet-printed at each first pixel region 200 by at least two nozzles (e.g., nozzles 10, 11, 12 in FIG. 5). the identical material is inkjet-printed at all the first pixel regions 200 in an identical column simultaneously by a sprayer including a plurality of nozzles, and then the sprayer is moved so as to inkjet print the corresponding material at the first pixel regions 200 in all the columns. For example, when three adjacent first pixel regions 200 include a red pixel region, a green pixel region and a blue pixel region, an organic light-emitting layer for emitting a red ray is formed at the first pixel regions 200 in a first column by a sprayer including a plurality of nozzles, and each first pixel region 200 corresponds to at least two nozzles. Then, the sprayer is moved to a fourth column so as to form the organic light-emitting layer for emitting the red color at the first pixel regions 200 in this column. This process is repeated until the organic light-emitting layer for emitting the red color is formed at all the red pixel regions. Similarly, an organic light-emitting layer for emitting a green ray and an organic light-emitting layer for emitting a blue ray may be formed at all the green pixel regions and the blue pixel regions, respectively.

As shown in FIGS. 2-5, the method for manufacturing the display substrate will be described hereinafter by taking the OLED display substrate as an example.

Step S1: forming the bottom electrode 5 of the OLED on the base substrate 100. The bottom electrode 5 is located at a position corresponding to the second pixel region 201. For the top-emission OLED display substrate, the bottom electrode may be made of a reflective material such as an Mg/Al alloy, an Mg/Ag alloy and an Ca/Ag alloy, and for the bottom-emission OLED display substrate, the bottom electrode may be made of a transmissive material, such as ITO, IZO and AZO. The base substrate may be a transparent substrate, such as a glass substrate, a quartz substrate or an organic resin substrate.

Step S2: forming the first layer on the base substrate 100 obtained from Step S1, and forming a pattern of the first layer by a patterning process. The pattern of the first layer is located at a region where the first pixel partition wall 101 and the second pixel partition wall 102 are located. The first layer may be formed on the base substrate 100 by such a film-forming process as sputtering, depositing, spinning or printing. The first layer may be made of resin, organic silicon or silicone dioxide.

Then, a photoresist is applied onto the first layer, and then exposed with a conventional mask, so as to form a photoresist-reserved region corresponding to a region when the first pixel partition wall 101 and the second pixel partition wall 102 are located, and a photoresist-unreserved region corresponding to the other region. The first layer at the photoresist-unreserved region is removed by dry etching, and then the remaining photoresist is removed so as to form the first layer 1011 of the first pixel partition wall 101 as well as the second pixel partition wall 102.

Step S3: forming the second layer on the base substrate 100 obtained from Step S2, and forming a pattern of the second layer by a patterning process. The pattern of the second layer is located at a region where the first pixel partition wall is located. The second layer may be formed on the base substrate 100 by such a film-forming process as sputtering, depositing, spinning or printing. The second layer may be made of resin, organic silicon or silicone dioxide. Then, a photoresist is applied onto the second layer, and then exposed with a conventional mask, so as to form a photoresist-reserved region corresponding to a region when the first pixel partition wall 101 is located, and a photoresist-unreserved region corresponding to the other region. The second layer at the photoresist-unreserved region is removed by dry etching, and then the remaining photoresist is removed so as to form the second layer 1012 of the first pixel partition wall 101.

The first pixel partition wall 101 and the second pixel partition wall 102 are formed as mentioned above. The first pixel partition wall 101 includes the first layer 1011 and the second layer 1012, the second pixel partition wall 102 merely includes the first layer, and a height difference between the first pixel partition wall 101 and the second pixel partition wall 102 is just a thickness of the second layer 1012. The first pixel regions 200 defined by the first pixel partition walls 101 are arranged in a matrix form, the second pixel regions 201 are defined by the second pixel partition walls 102 and a plurality of adjacent second pixel regions 201 are located at an identical first pixel region 200.

Step S4: forming an organic light-emitting layer 6 at the first pixel region 200 on the base substrate 100 obtained from Step S3, so as to form the organic light-emitting layers 6 at the second pixel regions 201 within the first pixel region 200. The organic light-emitting layer 6 is of a height greater than the thickness of the second layer 1012, so as to enable the organic light-emitting layers 6 at the first pixel region 200 to be connected to each other, and ensure an even thickness of the organic light-emitting layer 6 at the second pixel regions 201 within the first pixel region 200. The organic light-emitting layer 6 may be made of a pure organic substance, a doped substance, a phosphorescent material or a fluorescent material.

Step S5: forming a top electrode (not shown) on the base substrate 100 obtained from Step S4. When an appropriate bias voltage is applied between the top electrode and the bottom electrode 5, the organic light-emitting layer is excited to emit light through the injection, transport and recombination of carriers (electrons and holes), so as to achieve the display.

The OLED display substrate is obtained through the above steps. Of course, it may further include any other layers such as an electron transport layer and a hole transport layer, and the manufacture processes therefor are known in the art.

For a color filter substrate, the first pixel partition walls and the second pixel partition walls formed through the above-mentioned steps may form black matrices so as to define the pixel regions. Different from the OLED display substrate, a color filter layer through which a ray in a specific color is transmitted is inkjet-printed at the pixel region. For the other structures of the color filter substrate, e.g., a planarization layer and a common electrode, their manufacture processes are known in the art and thus will not be particularly defined herein.

The present disclosure further provides in one embodiment a display device including the above-mentioned display substrate. Due to the even thickness of the display layer, it is able to improve the display quality of the display device. The display device may be any product or member having a display function, such as a liquid crystal panel, an electronic paper, an OLED panel, a mobile phone, a flat-panel PC, a TV, a display, a laptop, a digital photo frame, and a navigator.

According to the embodiments of the present disclosure, the pixel partition walls of the display substrate include the first pixel partition walls for defining the first pixel regions and the second pixel partition walls for defining the second pixel regions, each first pixel partition wall is of a height greater than each second pixel partition wall, and a plurality of adjacent second pixel regions is located at an identical first pixel region. When an identical material is inkjet-printed at each first pixel region, the display layer may be of a thickness greater than the height of the second pixel partition wall. As a result, it is able to connect the display layers at each first pixel region to each other, and ensure an even thickness of the display layers at the second pixel regions, thereby to improve the quality of the display substrate as well as the display quality.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for manufacturing a display substrate, comprising steps of:
    forming pixel partition walls for defining pixel regions of the display substrate; and
    forming display layers at the pixel regions by inkjet printing,
    wherein the step of forming the pixel partition walls comprises:
    forming first pixel partition walls for defining first pixel regions and second pixel partition walls for defining second pixel regions, each first pixel partition wall being of a height greater than each second pixel partition wall, and a plurality of adjacent second pixel regions being located within an identical first pixel region, and the step of forming the display layers at the pixel regions by inkjet printing comprises:
    inkjet printing an identical material at each first pixel region by at least one nozzle, so as to form the identical display layer at the plurality of second pixel regions within the first pixel region, the display layer being an organic light-emitting layer of a thickness greater than the height of each second pixel partition wall.

2. The method according to claim 1, wherein the first pixel regions are each of a strip-like shape and arranged in a matrix form.

3. The method according to claim 1, wherein a short side of each first pixel region extends in a row direction, the identical material is inkjet-printed at all the first pixel regions in an identical column simultaneously by a sprayer including a plurality of nozzles, and the sprayer is moved so as to inkjet print the corresponding material at the first pixel regions in all the columns.

4. The method according to claim 1, wherein the identical material is inkjet-printed at each first pixel region by at least two nozzles.

5. The method according to claim 1, wherein the step of forming the first pixel partition walls and the second pixel partition walls comprises:
    forming patterns of first layers, the first layers being located at regions where the first pixel partition walls and the second pixel partition walls are located; and
    forming patterns of second layers on the first layers, the second layers being located at regions where the first pixel partition walls are located.

6. The method according to claim 1, wherein the display substrate is an organic light-emitting diode (OLED) display substrate or a color filter substrate of a liquid crystal panel.

7. The method according to claim 6, wherein when the display substrate is an OLED display substrate, an OLED for emitting a ray in a specific color is formed at each second pixel region,
    the method further comprises:
    forming a bottom electrode of the OLED on a base substrate;
    forming the second pixel partition walls on the base substrate with the bottom electrode, the second pixel partition walls defining the second pixel regions;
    forming the first pixel partition walls on the base substrate with the second pixel walls, the first pixel partition walls defining the first pixel regions, and the plurality of adjacent second pixel regions being located at an identical first pixel region; and
    inkjet printing an identical material at the first pixel regions by at least one nozzle, so as to form the display layers for emitting rays in an identical color at the plurality of second pixel regions within each first pixel region, the display layers at the first pixel regions in adjacent columns emitting rays in different colors.

8. A display substrate, comprising:
    pixel partition walls for defining pixel regions of the display substrate, the pixel partition walls comprising first pixel partition walls for defining first pixel regions and second pixel partition walls for defining second pixel regions, each first pixel partition wall being of a height greater than each second pixel partition wall, a plurality of adjacent second pixel regions being located at an identical first pixel region; and
    an identical display layer formed at the plurality of second pixel regions within each first pixel region, the display layer being an organic light-emitting layer of a thickness greater than the height of each second pixel partition wall.

9. The display substrate according to claim 8, wherein the first pixel regions are each of a strip-like shape and arranged in a matrix form.

10. The display substrate according to claim 8, wherein a short side of each first pixel region extends in a row direction, and the display layers at the first pixel regions in an identical column are made of an identical material and formed by a single inkjet printing process.

11. The display substrate according to claim 8, wherein each first pixel partition wall comprises a first layer and a second layer on the first layer, and each second pixel partition wall comprises the first layer.

12. The display substrate according to claim 11, wherein the first layer is of a thickness of 10 nm to 100 μm.

13. The display substrate according to claim 11, wherein the second layer is of a thickness of 100 nm to 100 μm.

14. The display substrate according to claim 8, wherein the display substrate is an organic light-emitting diode (OLED) display substrate, or a color filter substrate of a liquid crystal panel.

15. The display substrate according to claim 14, wherein when the display substrate is an organic light-emitting diode (OLED) display substrate, an OLED for emitting a ray in a specific color is arranged at each second pixel region, the display substrate comprises:
a bottom electrode of the OLED;
the second pixel partition walls for defining the second pixel regions; and
the first pixel partition walls for defining the first pixel regions, the plurality of adjacent pixel regions being located at an identical first pixel region, and
wherein the display layers for emitting rays in an identical color are arranged at the plurality of second pixel regions within each first pixel region, and the display layers at the adjacent first pixel regions in adjacent columns emit rays in different colors.

16. The display substrate according to claim 8, wherein three adjacent second pixel regions are located at an identical first pixel region.

17. A display device comprising the display substrate according to claim 8.

18. A display substrate, comprising:
pixel partition walls for defining pixel regions of the display substrate, the pixel partition walls comprising first pixel partition walls for defining first pixel regions and second pixel partition walls for defining second pixel regions, each first pixel partition wall being of a height greater than each second pixel partition wall, a plurality of adjacent second pixel regions being located at an identical first pixel region; and
an identical display layer formed at the plurality of second pixel regions within each first pixel region, the display layer being an organic light-emitting layer of a thickness greater than the height of each second pixel partition wall,
wherein each first pixel partition wall comprises a first layer and a second layer on the first layer, each second pixel partition wall comprises the first layer, and the first layer and the second layer are each made of resin, organic silicon or silicon dioxide.

19. The display substrate according to claim 18, wherein the first pixel regions are each of a strip-like shape and arranged in a matrix form.

20. The display substrate according to claim 18, wherein a short side of each first pixel region extends in a row direction, and the display layers at the first pixel regions in an identical column are made of an identical material and formed by a single inkjet printing process.

* * * * *